United States Patent
Pratt et al.

(10) Patent No.: US 8,433,263 B2
(45) Date of Patent: Apr. 30, 2013

(54) WIRELESS COMMUNICATION UNIT, INTEGRATED CIRCUIT AND METHOD OF POWER CONTROL OF A POWER AMPLIFIER THEREFOR

(75) Inventors: Patrick Pratt, Mallow (IE); Jau Horng Chen, Chandler, AZ (US); George Norris, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 224 days.

(21) Appl. No.: 13/120,519

(22) PCT Filed: Sep. 24, 2008

(86) PCT No.: PCT/IB2008/053875
§ 371 (c)(1),
(2), (4) Date: Mar. 23, 2011

(87) PCT Pub. No.: WO2010/035065
PCT Pub. Date: Apr. 1, 2010

(65) Prior Publication Data
US 2011/0201287 A1 Aug. 18, 2011

(51) Int. Cl.
*H04B 1/04* (2006.01)
*H01Q 11/12* (2006.01)

(52) U.S. Cl.
USPC ....... 455/126; 455/91; 455/127.1; 455/127.2; 455/114.3; 330/149; 375/296

(58) Field of Classification Search ............. 455/91, 455/114.2, 114.3, 115.1, 126, 127.1, 127.2, 455/127.3; 330/127, 129, 149; 375/296, 375/297
See application file for complete search history.

(56) References Cited

U.S. PATENT DOCUMENTS 5,196,808 A 3/1993 Pickett et al.
5,245,297 A 9/1993 Claydon et al.
(Continued)

FOREIGN PATENT DOCUMENTS

EP 1681771 A 7/2006
WO 01/05026 A 1/2001

OTHER PUBLICATIONS

Faulkner Michael et al: "Adaptive Linearization Using Predistortion-Experimental Results" IEEE Transactions on Vehicular Technology, vol. 43, No. 2, May 1994, pp. 323-332.

(Continued)

*Primary Examiner* — Pablo Tran

(57) ABSTRACT

A wireless communication unit comprises a transmitter having a forward path comprising a power amplifier, PA, and a feedback path arranged to feed back a portion of a signal output from the PA to a point in the forward path prior to the PA. The forward path and feedback path form a constant gain tracking (CGT) loop. The feedback path comprises an adaptive predistortion logic module located outside of the CGT loop and arranged to form an APD loop with the forward path and feedback path. The CGT loop comprises a controller logic module arranged to determine a gain offset of a signal routed through the forward path and feedback path and in response thereto set a drive level of the PA.

20 Claims, 5 Drawing Sheets

U.S. PATENT DOCUMENTS

| | | | |
|---|---|---|---|
| 6,160,449 | A | 12/2000 | Klomsdorf et al. |
| 6,211,733 | B1 | 4/2001 | Gentzler |
| 6,617,920 | B2 * | 9/2003 | Staudinger et al. ............ 330/149 |
| 6,628,165 | B1 * | 9/2003 | Henderson et al. ............. 330/85 |
| 6,798,843 | B1 * | 9/2004 | Wright et al. ................. 375/296 |
| 7,058,369 | B1 | 6/2006 | Wright et al. |
| 7,203,247 | B2 | 4/2007 | Bauder |
| 7,251,293 | B2 * | 7/2007 | Vella-Coleiro ............... 375/297 |
| 7,570,928 | B2 * | 8/2009 | Magoon et al. ............... 455/102 |
| 7,634,240 | B2 * | 12/2009 | Mitzlaff et al. ............ 455/127.3 |
| 7,904,045 | B2 * | 3/2011 | Aoki et al. .................... 455/260 |
| 8,213,880 | B2 * | 7/2012 | van Zelm et al. ............... 455/91 |
| 8,243,852 | B1 * | 8/2012 | Summerfield ................. 375/296 |
| 8,301,090 | B2 * | 10/2012 | Brown et al. ............. 455/114.3 |
| 2007/0287393 | A1 | 12/2007 | Nandipaku |
| 2008/0032634 | A1 | 2/2008 | Magoon et al. |
| 2008/0243899 | A1 | 10/2008 | Staudinger et al. |
| 2008/0298500 | A1 | 12/2008 | Norris et al. |
| 2009/0111399 | A1 | 4/2009 | Norris et al. |
| 2011/0136452 | A1 | 6/2011 | Pratt et al. |

OTHER PUBLICATIONS

International Search Report and Written Opinion correlated to PCT/IB2008/053875 dated May 7, 2009.

Hanington, G. et al., "High-Efficiency Power Amplifier Using Dynamic Power-Supply Voltage for CDMA Applications," IEEE Transactions on Microwave Theory and Techniques, vol. 47, No. 8, Aug. 1999, pp. 1471-1476.

Sahu, B. et al., "A High-Efficiency Power Amplifier with a Power-Tracking Dynamically Adaptive Buck-Boost Supply," IEEE Transactions on Microwave Theory and Techniques, vol. 52, No. 1, Jan. 2004, pp. 112-120.

Non-Final Office Action mailed Jul. 3, 2012 for U.S. Appl. No. 13/058,025, 11 pages.

International Search Report mailed Jul. 6, 2009 for International Application No. PCT/IB2008/053324, 2 pages.

* cited by examiner

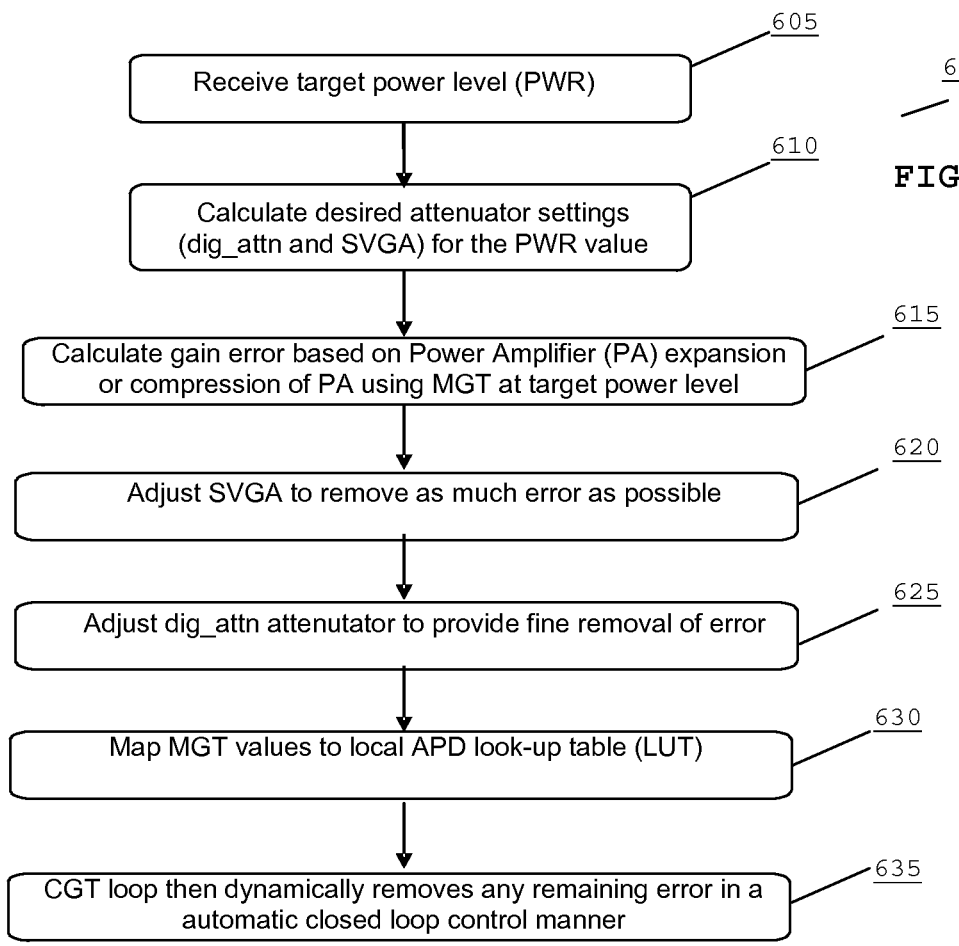

WIRELESS COMMUNICATION UNIT, INTEGRATED CIRCUIT AND METHOD OF POWER CONTROL OF A POWER AMPLIFIER THEREFOR

TECHNICAL FIELD

The technical field relates generally to a wireless communication unit, integrated circuit and method of power control of a power amplifier therefor. The technical field is applicable to, but not limited to, a wireless communication unit, integrated circuit and method of power control of a power amplifier used in an adaptive predistortion transmitter.

BACKGROUND

Wireless communication systems, for example cellular telephony or private mobile radio communication systems, typically provide for radio telecommunication links to be arranged between a plurality of base transceiver stations (BTS), referred to as Node Bs with regard to a universal mobile telecommunication system (UMTS), and a plurality of subscriber units, often referred to as user equipment (UE) in UMTS.

In a cellular network, such as UMTS, the power transmitted by a UE is regulated in order to minimise interference with other UEs. Typically, the output power generated by the radio frequency (RF) power amplifier (PA) in the UE will vary due to any number, or combination, of factors, such as the manufacturing process, operating temperature, supply voltage, antenna loading and other such factors. Thus, it often becomes necessary to measure the radio frequency transmit power at, or after, the PA output and to control a PA gain, typically by controlling the gain of amplifiers located earlier in the amplifier chain, in response to this measurement. This feedback will allow power control regulation to compensate for variations in PA supply voltage, operating temperature & manufacturing process.

Continuing pressure on the limited spectrum available for radio communication systems is forcing the development of spectrally-efficient linear modulation schemes. Since the envelopes of a number of these linear modulation schemes fluctuate, intermodulation products can be generated in the non-linear radio frequency power amplifier. Thus, it is important to ensure any unwanted terms arising from the intermodulation are minimised and stay below a specified value. By modifying the bias to improve efficiency the PA becomes more non-linear, which in turn would lead to increased intermodulation problems. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions. It is also known that non-linearities may also create in-band distortion, which is typically measured by determining an error vector magnitude (EVM). Quantum processes within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Furthermore, the emphasis in portable (subscriber) equipment is to increase battery life. The emphasis for base station designers is to reduce operating and equipment cost (power consumption, size, power dissipation, etc.). Hence, such operating efficiencies of the amplifiers used must be maximised. To achieve both linearity and efficiency, so called linearisation techniques are used to improve the linearity of the more efficient amplifier classes, for example class 'AB', 'B' or 'C' amplifiers. A number of linearising techniques exist, such as Cartesian Feedback, Feed-forward, and Adaptive Pre-distortion (APD) and these are often used to resolve the inherent trade off of linearity versus efficiency in wireless communication units.

The purpose of an APD system/circuit is to mitigate against any distortion arising from any dynamic amplitude modulation (AM) gain variation. For existing $3^{rd}$ generation communication standards, such as EDGE, WCDMA, OFDMA, etc., the AM of the signal to be transmitted changes as a result of a variable PA gain. The APD in a sense creates an inverse to this gain so that the total gain is a constant. To fully exploit the advantages of APD, a system that will automatically adjust the power amplifier (PA) supply is also required, so that it may be optimally biased across, say, the 3GPP power target range as well as in the presence of process, temperature and/or load variation. It is known that without such a power tracking or Envelope Tracking (ET) system the PA can become over-compressed, resulting in a poor adjacent channel leakage power ratio (ACLR) and/or error vector magnitude (EVM) failure. Alternatively, the PA may be under-compressed resulting in reduced efficiency performance.

Known techniques using APD have been targeted at base station applications where the requirements on optimally biasing the PA across load and power target variation are less severe compared to a handset wireless communication design. It is known that an adaptive predistortion loop, if operated in isolation, will function under limited operating regions. However, at certain operating corners the adaptive predistortion loop will not function robustly enough, due to the fact that the adaptive predistortion loop may have too much linear gain to adapt out.

U.S. Pat. No. 7,203,247 B2, titled 'Digital predistortion technique for WCDMA wireless communication system and method of operation thereof' describes a basic adaptive predistortion mechanism, but does not consider any aspect related to power levelling in an APD-based transmitter. A paper titled 'Adaptive linearization using predistortion-experimental results', authored by M. Faulkner and M. Johansson and published in 'Vehicular Technology, IEEE Transactions on, 1994' describes adaptive predistortion with power levelling. However, the power levelling method is limited to a simple gain modification in the APD feedback path. Thus, by facilitating gain modification in the APD feedback path, the APD system becomes much more complex and slower than desired or required.

SUMMARY OF THE INVENTION

A wireless communication unit, an integrated circuit and a method of performing power control in a transmitter are described, as defined in the accompanying Claims.

Further aspects and features of the invention are as defined in the accompanying dependent Claims and are disclosed in the embodiments of the invention to be described.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the invention.

FIG. 6 illustrates a flowchart of an example of a power control algorithm of a transmitter of a wireless communication unit.

DESCRIPTION OF EMBODIMENTS OF THE INVENTION

Figure 1:
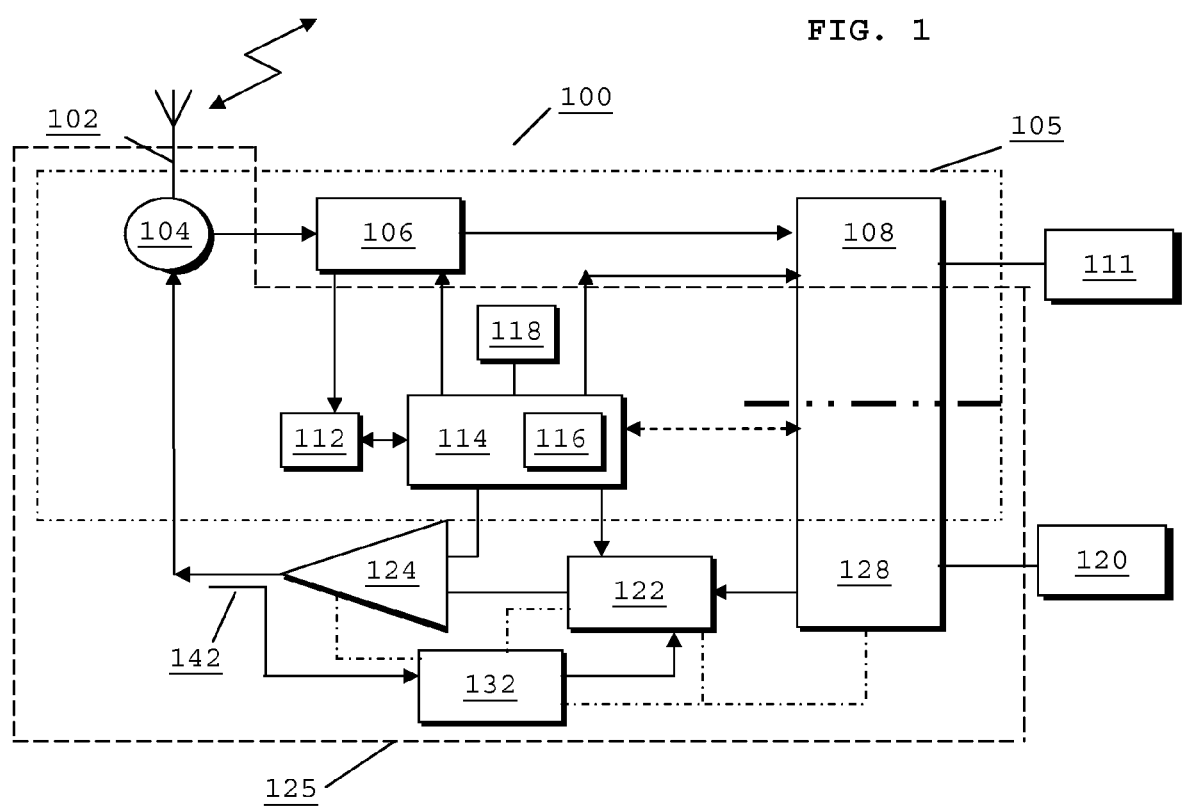
FIG. 1 illustrates a block diagram of an example of a wireless communication unit.

As explained below in more detail, in the shown examples, the power regulation loop functionality is separated from and individually treated, the APD function. In particular, a Constant Gain Tracking (CGT)-specific loop is placed inside an adaptive predistortion (APD) loop. The CGT-specific loop removes constant gain offsets with respect to the idealised or desired linear gain. The CGT-specific loop may, for example, regulate or set the average or constant root mean square (rms) gain of the loop. The CGT-specific loop is arranged to compare the instantaneous detected amplitude modulated (AM) signal to a delayed synchronised reference AM signal and adjust the transmit gain to drive the mean power towards its target. In doing so the root mean square (RMS) gain around the (APD) loop is normalised.

Concurrently, the APD can regulate the AM-dependent, dynamic, varying gain of the loop. Accordingly, the APD only has to linearise the transmit loop gain around a normalised operating point. Thereby, its rate of convergence may be accelerated and overall system performance may be improved.

Conventional automatic output control (AOC) systems are limited to off line, factory calibration and at most may have temperature and or battery sensors to adapt to environmental changes. The CGT loop may be initialised from the APD Master Gain Table (MGT). Hence, the CGT loop may be adaptive and capable of adapting to changes in the Power amplifier (PA) AM distortion characteristics. As the CGT loop is adaptive it is able to respond to changes in the transmit gain characteristics faster then a conventional (non adaptive) AOC loop.

One purpose of locating the CGT loop within an APD loop is to regulate or 'level' the average or mean power. Thereby, it may be to ensure that the output mean power is set and remains 'close' to a target power value. Thus, the CGT loop may set the gain of the transmit chain line-up to achieve a given average target output power (Pout), where:

$$Pout = Gaverage \times Pin,$$

Where:
Pin is the input average power of the transmit chain line-up, and
Gaverage is the average gain of the line up).

Thus, in this manner, the CGT loop sets the required Gaverage for a given target Pout. Furthermore, the locating of a CGT loop within an APD loop may enable removing constant gain offsets and, thus, enable centering the predistortion (PD) operation around a normalized operating point, thereby accelerating adaptation of the APD logic module.

Before describing in detail examples it should be observed that the apparatus components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

In the following, a mechanism is described for adjusting the PA supply voltage Vcc as an example. However, the same technique may be used to adjust a PA bias voltage. Thus, hereinafter reference to a PA supply voltage in the specification and claims is meant to encompass both.

Referring now to FIG. 1, a block diagram of an example of a wireless communication unit 100 adapted to support the inventive concept of the invention, is illustrated. For the sake of clarity, the wireless communication unit 100 is shown as divided into two distinct portions: a receiver chain 105 and a transmitter chain 125.

The wireless communication unit 100 contains an antenna 102. In this example, the antenna 102 is coupled to an antenna switch 104 that provides signal control of radio frequency (RF) signals in the wireless communication unit 100, as well as isolation between the receiver chain 105 and transmitter chain 125. The antenna switch 104 may be replaced by a duplex filter, for frequency duplex communication units as is known to those skilled in the art.

For completeness, the receiver 105 of the wireless communication unit 100 will be briefly described. The receiver 105 includes a receiver front-end circuit 106 (which provides reception, filtering and intermediate or base-band frequency conversion). The front-end circuit 106 is serially coupled to a signal processing function (generally realised by at least one receiving signal processing unit, such as digital signal processor (DSP)) 108. An output from the at least one digital signal processor 108 is provided to a user interface 111, which in a receiving context may comprise a suitable output device, such as a screen or loudspeaker. A controller 114 is operably coupled to the front-end circuit 106. A memory device 116 stores data, such as data relating to decoding/encoding functions and the like. A timer 118 is operably coupled to the controller 114 to control the timing of operations, namely the transmission or reception of time-dependent signals.

As regards the transmit chain 125, this essentially includes an input device 120, such as a keypad, or microphone operably coupled to signal processing logic 128 and transmitter/modulation circuitry 122 and an up-converter/power amplifier 124. A skilled artisan will appreciate that the signal processing unit 128 in the transmit chain may be implemented as distinct from a receiving signal processing unit in the receive chain. Alternatively, a single unit, e.g. a single DSP may be used to implement processing of both transmit and receive signals, as shown in FIG. 1.

As described hereafter in the examples, the signal processing unit 128, transmitter/modulation circuitry 122 and the up-converter/power amplifier 124 are operationally responsive to the controller 114, with an output from the power amplifier 124 coupled to the antenna switch 104. A feedback circuit includes a detector (not shown) and down-converter 132, which together with the transmitter/modulation circuitry 122, power amplifier 124 and a directional coupler 142, forms a closed feedback loop.

Figure 2:
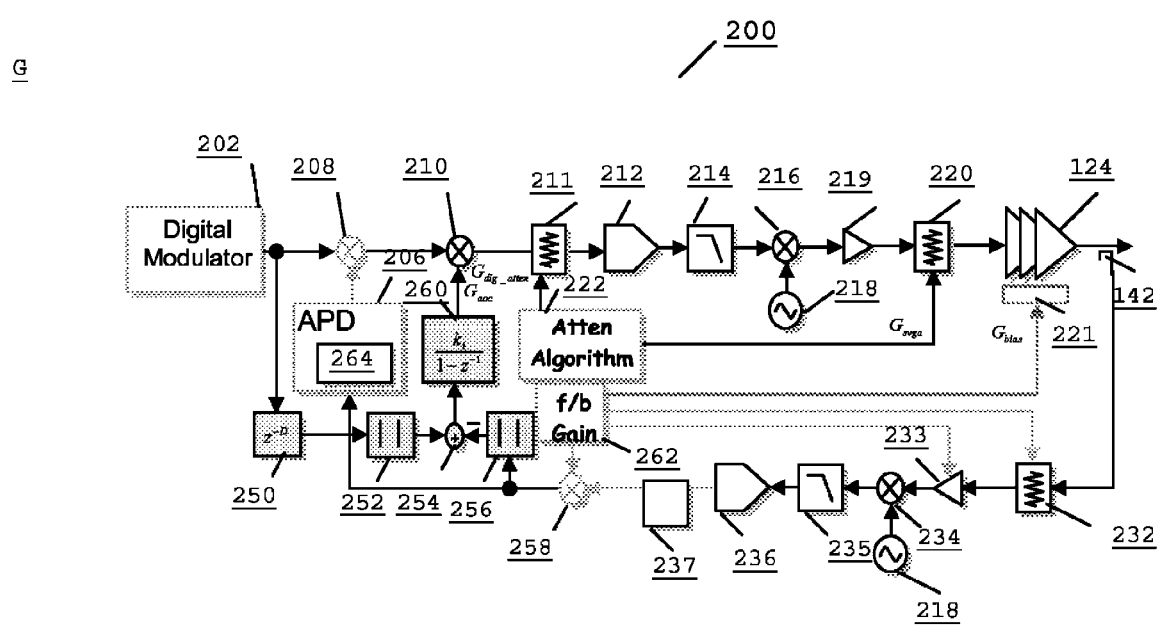
FIG. 2 illustrates a more detailed block diagram of an example of a transmitter of a wireless communication unit employing an adaptive predistortion system.

Referring now to FIG. 2, an example of a transmitter architecture 200, is shown. The shown transmitter architecture 200 comprises a digital logic module 202 arranged to provide a digitally modulated input signal to the transmitter chain. The digitally modulated input signal is input to a first multiplier unit 208, where the digitally modulated input signal is multiplied with a predistortion signal provided by an adaptive pre-distortion (APD) logic module 206. The APD logic module 206 provides a complex I/Q signal to the digitally modulated input signal to ensure that the signal output from the power amplifier 124 is linear in nature. The output from the first multiplier unit 208, and therefore the output from the outer APD loop, is input to a second multiplier unit 210, where it is multiplied with a signal provided by a constant gain tracking (CGT) loop.

The second multiplier unit 210 inputs a scaled (i.e. multiplied) I/Q signal to a digital-to-analogue converter (DAC) 212, which converts the input digital signal to an analogue output signal. The scaling is controlled via a digital variable attenuator 211. The DAC 212 outputs the analogue output signal to a low-pass filter (LPF) 214 that rejects high frequency undesired analogue signals. The output from the LPF 214 is input to an up-mixer 216 arranged to frequency up-convert the analogue, filtered signal with a local oscillator (LO) 218 reference signal. The up-converted signal is input to an amplifier 219 and a gain adjustment circuit or element (such as a variable attenuator) 220, which is controlled by an attenuator logic module 222. The gain adjusted signal is then input to a power amplifier chain 124, where it is amplified and routed to an antenna (not shown). The gain of the PA 124 is controlled by a gain_bias signal 221.

A directional coupler 142 is arranged to couple a portion of the amplified transmit signal into a feedback path comprising a further gain adjustment circuit or element 232. The gain adjusted feedback signal is input to a RF gain circuit or element 233 and a down-mixer 234 arranged to frequency down-convert the coupled, gain-adjusted transmit signal with the LO 218 reference signal. The combination of the further gain adjustment circuit or element 232, the RF gain circuit or element 233 and down-mixer 234 may be considered as a feedback detector, which may be implemented as a zero intermediate frequency (ZIF) coherent receiver.

The down-converted signal is input to a LPF 235 to filter out undesirable mixed signals and thereafter to an analogue-to-digital converter (ADC) 236, where it is converted into a digital form. The digital signal from the ADC 236 is then input to a third multiplier unit 258, where the digital signal is multiplied with a gain adjustment value provided by feedback gain control module 262. Feedback gain control module 262 also provides gain control signals to RF amplifier 233 and variable RF attenuator 232 in the feedback path, and controls the DC supply to the PA 124 to control the gain of the PA. The setting of the variable RF attenuator 232 is selected based on the mean output power target of the transmitter and may be chosen such that signal-to-noise ratio (SNR) and linearity of the transmitter are improved for a given target output power level.

The output from the third multiplier unit 258 is input to APD logic module 206, which corrects for both amplitude and phase distortions caused by the PA 124 in the following manner. It should be noted that if the system was ideal and perfectly linear, then the transmitted amplitude and phase (output from the PA 124) would be identical to the detected amplitude and phase (for example the detected output from the ADC 236 (with the exception of a random but constant phase offset). However, in practice the PA exhibits a nonlinearity that corrupts or distorts the amplitude modulated (AM) and phase modulated (PM) components of the original input signal. Thus, the APD logic module 206 predistorts the transmit signal, such that the detected AM and PM components (as translated by ADC 236 and represented at the output of the PA 124) are as close as possible to the original AM and PM components of the original input signal. In addition to the distortion of the PA corrupting the PM component of the output signal, the PA 124 will in practice also introduce an arbitrary phase offset to the transmitted PM, which is generally known or referred to as Phase Insertion. The amount of phase insertion is random, while dependent on temperature, voltage, loading, etc. The APD logic module 206 attempts to correct for these factors when applying a correction signal to the first multiplier unit 208. To overcome the problems arising from insertion phase offset, quadrature imbalance and DC offset of the feedback signal, a calibration system 237 may be present. In the example of FIG. 2, this calibration operation is performed by the calibration system 237 independently of, and separately to, the APD.

The output from the third multiplier unit 258 is converted into its amplitude or magnitude equivalent (i.e. the magnitude of the complex, I-Q detected signal) by magnitude logic module 256 before being applied to subtracting logic module 254. The input digital signal provided by the digital modulator logic module 202 is delayed in delay element 250, converted to AM by logic module 252 and then applied to subtracting logic module 254. The output from subtracting logic module 254 is provided to gain logic module 260 to provide a multiplication value. The multiplication value from gain logic module 260 is applied to second multiplier unit 210, thereby completing the CGT loop. By selecting an appropriate multiplication value, it is possible to effect and absolutely scale (via the CGT loop) a desired average output power Pout of PA 124.

In the shown examples the inner CGT loop is arranged to control the attenuation of variable attenuators, such as variable attenuator 220, based on an evolution of the APD master gain table (MGT) 264. In this manner, the CGT loop is linked to the APD operation so that its initial factory-phased gain settings are adaptive and modified by the particular gain expansion or compression of the PA at the given target power, as determined by the APD MGT 264. The use of the CGT loop closed around the instantaneous AM signal generating elements is therefore able to remove constant gain offsets arising from imperfect factory phasing and any subsequent drift. This is achieved by the CGT loop attempting to normalize the AM distortion characteristics around the target mean power. In addition, the CGT loop achieves the final, fine gain control or power levelling, to set the mean target power of the transmitter and thereby accelerate speed of convergence of the APD loop.

The coarse gain may be partitioned into three stages:
(i) the PA gain, which can be set via a bias control signal, $G_{bias}$;
(ii) a segmented variable gain attenuator 220, $G_{svga}$; and
(iii) a digital attenuator, $G_{dig\_atten}$ as shown in FIG. 2.

The particular PA gain and bias settings may, for example, be read from a factory phase look-up table (LUT) (not shown) indexed by the Power Control Level (PCL), modulation mode and frequency band and are programmed in advance of transmitting on a particular cellular communication system, for example a $2^{nd}$ Generation (2G) transmit multislot and $3^{rd}$ Generation (3G) Random Access Channel (RACH), or subject major power transition in the case of 3G. The contents of the MGT 264 are not used in determining the PA gain in this example.

Figure 3:
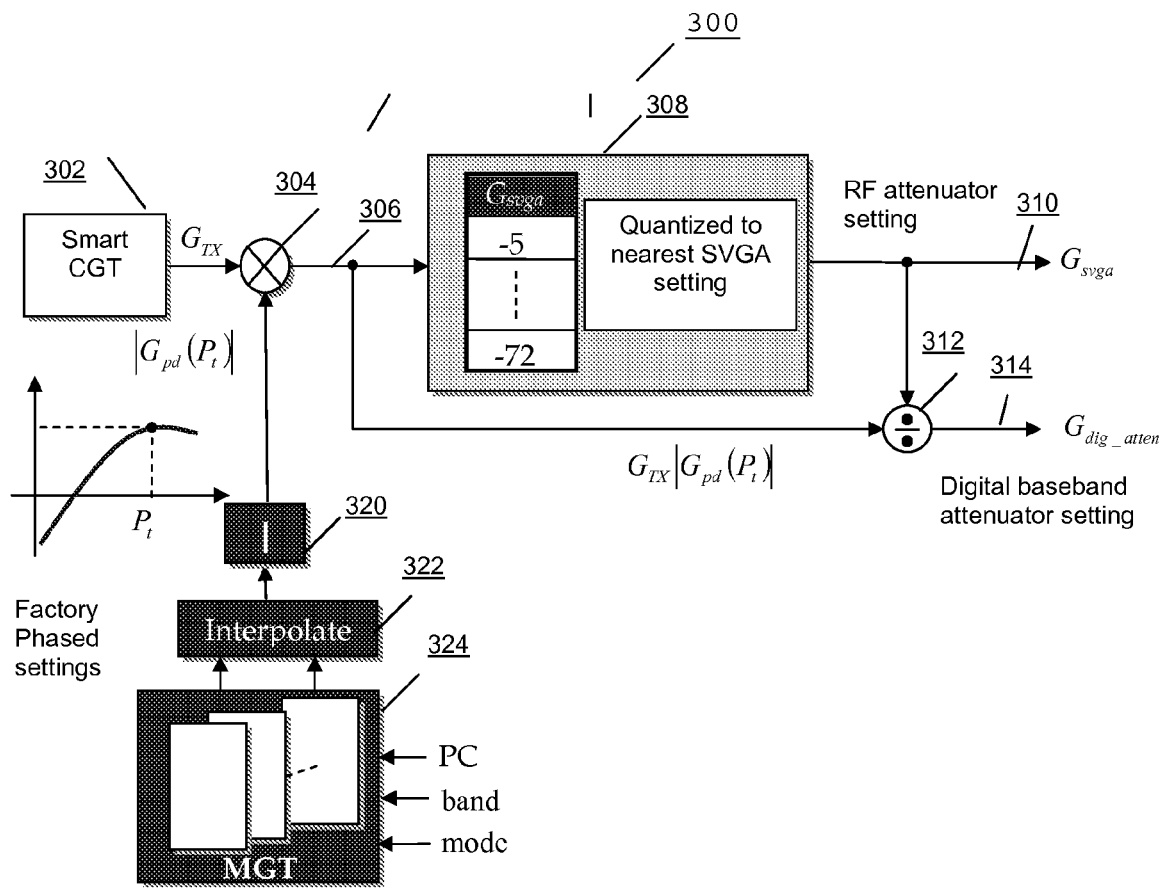
FIG. 3 illustrates a more detailed block diagram of an automatic output power control arrangement of a wireless communication unit transmitter.

Referring now to FIG. 3, a more detailed block diagram of an automatic output power control arrangement of a wireless communication unit transmitter, adapted in accordance with embodiments of the invention, is illustrated. The LUT may for example be phased at, say, three power settings, high power, medium power and low power. Interpolation logic module 322 may be arranged to interpolate between these three phased values to establish the required Segmented Voltage Gain Amplifier (Svga) setting or code for the full range of power control levels. In addition, the CGT logic module 302 may also be arranged to calculate a virtual attenuator setting that is equivalent to the total or combined ideal setting, taking into account the various controllable attenuator and gain settings, such as a digital attenuator and any radio frequency variable gain attenuator (such as the Svga), etc. This gain is referred to here as $G_{TX}$ and can be understood as the combined attenuator setting that would level the mean power exactly at the target value if the phasing conditions (temperature, loading, supply) were still valid. The digital attenuator or back-off may be pre-calculated by the CGT logic module 302 to correct for the finite resolution or quantisation effect of the Svga, as quantized in DAC 308:

$$G_{dig\_atten} = G_{TX}/G_{svga}.$$

It should be noted that a 'linear' mode of operation encompassed when the PA is biased such that the PA nonlinearity is deemed negligible (for example when the peak AM is well backed off or below 1 dB compression so that the adjacent channel leakage ratio (ACLR) and error voltage magnitude (evm), etc. are within the regulated specification without a need for any linearization systems, such as APD. Thus, in the example the CGT logic module 302 is phased with gain values based on such linear operation. In contrast, a nonlinear mode of operation is where the bias is modified such that the peak AM extends into a soft compression region, thereby resulting in degraded ACLR and EVM unless a linearization technique, such as APD is used.

In nonlinear mode, the attenuator settings are adjusted to correct for any post-phasing changes to the amount of gain compression or expansion at the target power. For example, supposing that relative to the phasing point, the PA gain is expanded by xdB at the particular target power, then the attenuator gains must be compressed by xdB. In general, this correction may be expressed by:

$$G_x = \frac{X_{rms}}{Y_{rms}} \quad [1]$$

where:
$X_{rms}$ represents the transmitted baseband rms for the desired target power; and
$Y_{rms}$ represents the resultant, detected, baseband rms value.

In essence, $G_x$ is the inverse rms gain of the loop for the given target power. If the loop has not shifted from its phasing point then $G_x=0$ dB and no correction is required. Otherwise correction of the phased attenuator settings is desirable to minimize or at least reduce subsequent training of the APD. This inverse rms gain can be evaluated from the MGT 264 at the target power, i.e.

$$G_x = |G_{pd}(P_t)| \quad [2]$$

In the example of FIG. 3, the total attenuation (digital attenuator 314 plus Svga 310) is first read out of the CGT phasing table (MGT 324). This gain (or total attenuation) is then scaled by the predistortion gain, $|G_{pd}(P_t)|$ obtained from MGT 324 (such as an APD LUT) to produce the total corrected gain required to level the power at the target value. This gain (or total attenuation) is then quantized in a simple forward step to find a Svga setting that is nearest to Gtx, 308 to produce the applied Svga attenuation level 310. The digital attenuator setting 314 can then be calculated from the quantized Svga, in divider module 312 according to:

$$G_{dig\_att} = G_{TX}|G_{pd}(P_t)|/G_{svga}. \quad [3]$$

The absolute power levelling and accuracy of the CGT loop is determined by the gain of the detector, and is controlled at two points along the detector path, an RF/analogue step attenuator and digital gain stage (not shown).

Figure 4:
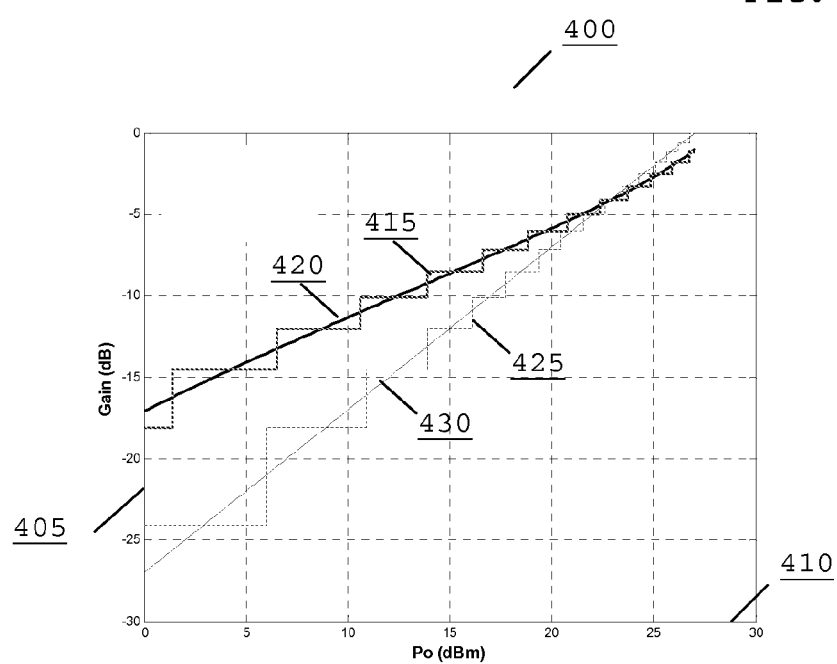
FIG. 4 illustrates a graphical representation of gain versus output power for the transmitter and RF attenuator of a wireless communication unit transmitter.

Referring now to FIG. 4, a graphical representation 400 of gain 405 versus output power 410 is illustrated for a wireless communication unit's transmitter. The graphical representation 400 also illustrates the virtual gain Gtx for a linear PA 430 and the corresponding Svga settings (i.e. Gtx rounded to the nearest Svga setting) when the transmitter is operating in an APD mode of operation. Similarly, the graphical representation 400 illustrates the equivalent gains 415, 420 when the transmitter is operating with a nonlinear biased PA.

Figure 5:
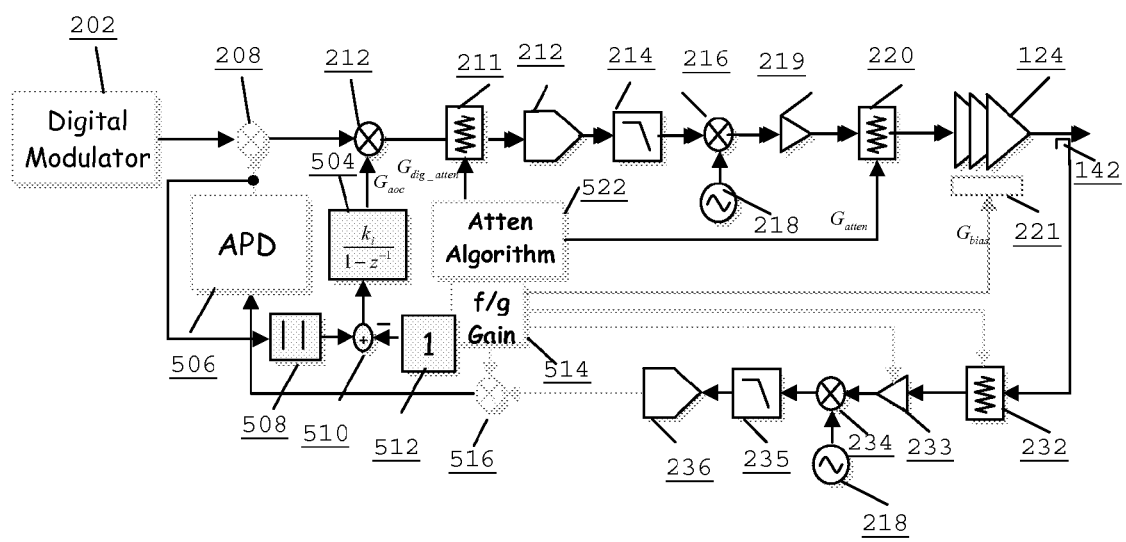
FIG. 5 illustrates a more detailed block diagram of another example of an alternative transmitter architecture of a wireless communication unit employing an adaptive predistortion system.

FIG. 5 illustrates a block diagram of another transmitter architecture 500 of a wireless communication unit employing an adaptive predistortion system. In a similar manner to the architecture 200 of FIG. 2, the transmitter architecture 500 comprises a majority of the same circuits and elements, the operation of which will not be replicated here for simplicity purposes only. The primary difference between the architecture 200 of FIG. 2 and the transmitter architecture 500 of FIG. 5 is as follows.

The output from the third multiplier unit 258 is input to unity gain logic module 512 before being applied to subtracting logic module 510. The linearising input digital signal provided by the APD logic module 506 to the first multiplier unit 208 is also applied to subtracting logic module 510 after being passed through an absolute logic module 508, (which may be understood as providing a magnitude of a complex gain of the APD loop converted to absolute gain). As in FIG. 2, the output from subtracting logic module 510 is provided to gain logic module 504 to provide a multiplication value. The multiplication value from gain logic module 504 is applied to second multiplier unit 210, thereby completing the CGT loop. By selecting an appropriate multiplication value, it is possible to effect and absolutely scale (via the CGT loop) a desired average output power Pout of PA 124.

In this example, the inner CGT loop is arranged to calculate the gain output of the APD logic module 506. In effect, the instantaneous absolute gain of the APD is compared to unity or '1'. The digital gain is then adjusted so that the average error (where the error is equal to a difference between APD magnitude gain and unity) is minimised. This effectively adjusts the digital gain 212 until the average magnitude APD gain is unity. This is, in effect, the function of the CGT loop, which is to set the gain so that the APD operates around a normalised of unity, i.e. its average or mean gain should be unity.

FIG. 6 illustrates a flowchart 600 of an example of a constant gain tracking mechanism of a transmitter of a wireless communication unit. In this Figure, the flowchart 600 illustrates the operation of a CGT-specific loop located within an adaptive predistortion (APD) loop and arranged to regulate or set the average or constant root mean square (rms) gain of the loop. The CGT-specific loop is arranged to compare the instantaneous detected amplitude modulated (AM) signal to a delayed synchronised reference AM signal and adjust the transmit gain to drive the mean power towards its target. Thus, the operation of the CGT-specific loop serves to remove any constant gain offsets with respect to the idealised or desired linear gain. In doing so the RMS gain around the (APD) loop is normalised.

The mechanism commences with receiving a target power level (PWR), as shown as indicated with 605. The target power level (PWR) may be an input supplied from a 'higher level' or layer that represents the target (average) power. Next, as indicated with 610, a CGT algorithm calculates the desired attenuator settings, for example dig_atten and Segmented Voltage Gain Amplifier (Svga) settings, for the given PWR value. The dig_atten value refers to a digital, baseband amplifier, i.e. a multiplier that scales the digital baseband I/Q signal and the Svga setting is an RF based step attenuator having non-uniform attenuation steps. The combined gain of the digital attenuator and the Svga would ideally (if the factory phased settings (temp. loading, battery etc) were still applicable) provide the desired power levelling. However, due to temperature, loading, battery and/or process variation within the communication unit the power levelling will be imperfect, thereby resulting in an offset or gain error in either dig_atten and/or the Svga setting. This error is corrected by adjusting either the Svga and/or the digital attenuator, as follows.

The flowchart continues with a calculation of gain error based on PA expansion or compression of PA using MGT at the target power value, as shown as indicated with 615. Due to temperature, battery and/or load variation, the PA gain at the target power will deviate from the original factory gain value. This gain offset will be calculated by the MGT as indicated with 615 and may be used to correct the CGT attenuator/gain settings. For example, the Svga may be first adjusted to correct for 'as much' of this (coarse) error as possible, as shown as indicated with 620. The Svga may have a limited number of settings, for example in a similar manner to the quantisation effect of a digital-to-analogue converter (DAC). To remove as much of the gain error the Svga may be adjusted with the residual (fine) error being corrected by adjusting the digital attenuator setting, as indicated with 625.

The MGT values are then mapped to the localised APD look-up table, as shown as indicated with 630. Ideally if the above adjustments to the CGT settings are correct, the power should be leveled exactly. However, the MGT values may not be updated fast enough to track variations in the transmit gain, with the result that there may be residual gain errors causing an offset in the mean target power. The CGT loop may then dynamically remove this remaining error in an automatic closed loop control fashion, as shown as indicated with 635.

It will be understood that the examples of a wireless communication unit, integrated circuit and method of controlling an output power of a PA in a transmitter, as described above, may facilitate a radio transmitter to run deeper into compression, and hence more efficiently, regardless of process, load and/or temperature variation. In this manner, the radio transmitter is arranged to optimally, or at least improve, bias of a PA for both minimum or at least reduced current consumption and minimum, or at least reduced, nonlinearity, for example in a variable data rate 3G phone, across power target, process, temperature and load. This ultimately saves current consumption and thereby extends talk time for the radio transmitter. Furthermore, if an operating condition occurs that implies that the switcher voltage is too low, then the system is sufficiently intelligent to automatically back off the target power. In addition, the examples continuously operate a switcher loop, making its performance less susceptible to operating condition variations. Also, the examples are capable of being more aggressive in terms of operating the PA deeper in saturation, while maintaining good spectral performance.

In particular, the shown examples use two separate control loops: a constant gain tracking (CGT) loop arranged to eliminate the constant gain error (that would otherwise need to be taken out by all of the taps on the adaptive predistortion loop). The CGT loop normalizes the system to facilitate a more robust operation of the adaptive predistortion loop around the normalised target mean power level.

Those skilled in the art will realize that the above recognized advantages and other advantages described herein are merely exemplary and that the invention does not require all of these advantages to be obtained.

It will be appreciated that the examples described herein may be comprised of one or more generic or specialized processors (or 'signal processors') such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus for performing power control described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Both the state machine and ASIC are considered herein as a 'signal processor' for purposes of the foregoing discussion and claim language.

Moreover, an embodiment of the invention can be implemented as a computer-readable storage element having computer readable code stored thereon for programming a computer (e.g., comprising a processing device) to perform a method as described and claimed herein. Examples of such computer-readable storage elements include, but are not limited to, a hard disk, a CD-ROM, an optical storage device, a magnetic storage device, a Read Only Memory (ROM), a Programmable Read Only Memory (PROM), an Erasable Programmable Read Only Memory (EPROM), an Electrically Erasable Programmable Read Only Memory (EEPROM) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

In the foregoing specification, specific embodiments of the invention have been described. However, one of ordinary skill in the art appreciates that various modifications and changes can be made without departing from the scope of the invention as set forth in the claims below.

Accordingly, the specification and figures are to be regarded in an illustrative rather than a restrictive sense, and all such modifications are intended to be included within the scope of invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Moreover in this document, relational terms such as first and second, top and bottom, and the like may be used solely to distinguish one entity or action from another entity or action without necessarily requiring or implying any actual such relationship or order between such entities or actions.

The terms 'comprises', 'comprising', 'has', 'having', 'includes', 'including', 'contains', 'containing' or any other variation thereof, are intended to cover a non-exclusive inclusion, such that a process, method, article, or apparatus that comprises, has, includes, contains a list of elements does not include only those elements, but may include other elements not expressly listed or inherent to such process, method, article, or apparatus. An element proceeded by 'comprises . . . a', 'has . . . a', 'includes . . . a', 'contains . . . a' does not, without more constraints, preclude the existence of additional identical elements in the process, method, article, or apparatus that comprises, has, includes, contains the element. The terms 'a' and 'an' are defined as one or more, unless explicitly stated otherwise herein.

The terms 'substantially', 'essentially', 'approximately', 'about' or any other version thereof, are defined as being close to as understood by one of ordinary skill in the art. The term 'coupled' as used herein is defined as connected, although not necessarily directly and not necessarily mechanically. A device or structure that is 'configured' in a certain way is configured in at least that way, but may also be configured in ways that are not listed.

The invention claimed is:

1. A wireless communication unit comprising a transmitter having a forward path comprising a power amplifier, PA, and a feedback path arranged to feed back a portion of a signal output from the PA to a point in the forward path prior to the PA wherein the forward path and feedback path form a constant gain tracking, CGT, loop and the feedback path comprises an adaptive predistortion, APD, logic module located outside of the CGT loop and arranged to form an APD loop with the forward path and feedback path, wherein the CGT loop comprises a controller logic module arranged to determine a gain offset of a signal routed through the forward path and feedback path and in response thereto set a drive level of the PA by controlling a gain setting of a plurality of attenuators.

2. The wireless communication unit of claim 1 wherein the controller logic module of the CGT loop is arranged to automatically adapt the drive level of the PA in response to a determination of a gain change.

3. The wireless communication unit of claim 1 wherein the controller logic module is arranged to automatically adapt the drive level of the PA to a nominal drive level such that the APD logic module linearises a signal output from the PA around the nominal drive level.

4. The wireless communication unit of claim 1 wherein the controller logic module is arranged to set a drive level of the PA by first controlling a coarse gain setting of a radio frequency attenuator located in the forward path.

5. The wireless communication unit of claim 1 wherein the controller logic module is arranged to set a drive level of the PA by subsequently controlling a fine gain setting of a digital attenuator located in the forward path.

6. An integrated circuit for performing power control of a transmitter comprising a power amplifier, PA, the integrated circuit comprising a forward path and a feedback path operably coupleable to the PA, wherein the forward path and feedback path form a constant gain tracking, CGT, loop and the feedback path comprises an adaptive predistortion, APD, logic module located outside of the CGT loop and arranged to form an APD loop with the forward path and feedback path, wherein the CGT loop comprises a controller logic module arranged to determine a gain offset of a signal routed through the forward path and feedback path and in response thereto set a drive level of the PA by controlling a gain setting of a plurality of attenuators.

7. The integrated circuit of claim 6 wherein the controller logic module of the CGT loop is arranged to automatically adapt the drive level of the PA in response to a determination of a gain change.

8. The integrated circuit of claim 6 wherein the controller logic module is arranged to automatically adapt the drive level of the PA to a nominal drive level such that the APD logic module linearises a signal output from the PA around the nominal drive level.

9. The integrated circuit of claim 6 wherein the controller logic module is arranged to set a drive level of the PA by first controlling a coarse gain setting of a radio frequency attenuator located in the forward path.

10. The integrated circuit of claim 6 wherein the controller logic module is arranged to set a drive level of the PA by subsequently controlling a fine gain setting of a digital attenuator located in the forward path.

11. A method of power control in a wireless communication unit comprising a transmitter having a forward path comprising a power amplifier, PA, and a feedback path for feeding back a portion of a signal output from the PA to a point in the forward path prior to the PA, such that the forward path and feedback path form a constant gain tracking, CGT, loop and the feedback path further comprises an adaptive predistortion, APD, logic module located outside of the CGT loop and arranged to form an APD loop with the forward path and feedback path, wherein the method comprises:
determining a gain offset of a signal routed through the forward path and feedback path in the CGT loop, and
in response thereto setting a drive level of the PA by controlling a gain setting of a plurality of attenuators.

12. The method of claim 11 further comprising linearising a signal output from the PA around the drive level of the PA set based on the determined gain offset.

13. The method of claim 11 further comprising automatically adapting the drive level of the PA in response to a determination of a gain change.

14. The method of claim 11 further comprising automatically adapting the drive level of the PA to a nominal drive level such that the APD logic module linearises a signal output from the PA around the nominal drive level.

15. The method of claim 11 further comprising setting a drive level of the PA by first controlling a coarse gain setting of a radio frequency attenuator located in the forward path.

16. The method of claim 11 further comprising setting a drive level of the PA by subsequently controlling a fine gain setting of a digital attenuator located in the forward path.

17. A computer-readable storage element having computer readable code stored thereon for programming a computer to perform a method for power control in a wireless communication unit comprising a transmitter having a forward path comprising a power amplifier, PA, and a feedback path for feeding back a portion of a signal output from the PA to a point in the forward path prior to the PA, such that the forward path and feedback path form a constant gain tracking, CGT, loop and the feedback path further comprises an adaptive predistortion, APD, logic module located outside of the CGT loop and arranged to form an APD loop with the forward path and feedback path, wherein the code is operable for:
  determining a gain offset of a signal routed through the forward path and feedback path in the CGT loop, and
  in response thereto setting a drive level of the PA by controlling a gain setting of a plurality of attenuators.

18. The computer-readable storage element of claim 17 wherein the computer readable storage element comprises at least one of: a hard disk, a CD-ROM, an optical storage device, a magnetic storage device, a Read Only Memory, ROM, a Programmable Read Only Memory, PROM, an Erasable Programmable Read Only Memory, EPROM, an Electrically Erasable Programmable Read Only Memory, EEPROM and a Flash memory.

19. The computer-readable storage element of claim 17 wherein the code is further operable for automatically adapting the drive level of the PA to a nominal drive level such that the APD logic module linearises a signal output from the PA around the nominal drive level.

20. The computer-readable storage element of claim 17 wherein the code is further operable for setting a drive level of the PA by first controlling a coarse gain setting of a radio frequency attenuator located in the forward path.

* * * * *